United States Patent [19]

May et al.

[11] 4,038,568
[45] July 26, 1977

[54] PULSE PEAK SAMPLE AND HOLD CIRCUIT

[75] Inventors: Klaus D. May; Anthony T. Nasuta, Jr., both of Baltimore, Md.

[73] Assignee: The United States of America as represented by the Secretary of the Air Force, Washington, D.C.

[21] Appl. No.: 660,573

[22] Filed: Feb. 23, 1976

[51] Int. Cl.² .............................................. H03K 5/20
[52] U.S. Cl. ...................................... 307/351; 307/353; 307/358; 324/103 P; 328/115; 328/151
[58] Field of Search ........... 307/235 A, 235 B, 235 C, 307/235 J, 238; 328/114.7, 132, 151; 340/347 SH; 324/103 R, 103 P

[56] References Cited

U.S. PATENT DOCUMENTS

| 3,723,763 | 3/1973 | Udovic | 307/251 X |
| 3,815,026 | 6/1974 | Kraft et al. | 324/103 P |
| 3,875,516 | 4/1975 | Thomas | 307/235 A |

Primary Examiner—John Zazworsky
Attorney, Agent, or Firm—Joseph E. Rusz; George Fine

[57] ABSTRACT

A pulse peak sample and hold circuit includes a passive input integrator to develop the time of a sample gate. A sensitive comparator develops the gate pulse. A FET and storage capacitor "holds" the actual input amplitude. The circuit is independent of PRF and pulse width.

1 Claim, 6 Drawing Figures

PULSE PEAK SAMPLE AND HOLD CIRCUIT

STATEMENT OF GOVERNMENT INTEREST

The invention described herein may be manufactured and used by or for the Government for governmental purposes without the payment of any royalty thereon.

BACKGROUND OF THE INVENTION

In alignment and troubleshooting of circuits involving calibration of voltage or current pulse amplitudes, such as the beam current of a pulsed TWT, it is necessary to accurately monitor the amplitude of pulse transformers and display the waveforms on an oscilloscope.

There are several techniques for measuring pulse amplitudes. One method displays the pulse with or without a pulse transformer on an oscilloscope and measures its amplitude. This method is generally not very accurate, being limited by the oscilloscope accuracy of 2 to 3 percent unless expensive, differential comparator type input processing is utilized. In addition valuable time is being spent setting up the oscilloscope and human error is introduced in interpreting the display. Another prior method is the use of convention sample and hold circuits, in conjunction with a measuring device such as a digital panel meter. This method greatly increases accuracy but requires some type of accurate timing circuit to produce sample gates during the pulse whose amplitude is being determined. The circuit requires adjustments as to gain, voltage offset, as well as timing for the sample gate.

The present invention allows for a simple, inexpensive, continuous accurate monitoring of pulse amplitude by any high impedance measuring device (such as a digital panel meter), without resorting to display techniques such as an oscilloscope or transient analyzer. The device makes use of sample and hold techniques for storing amplitudes of pulse waveforms. The circuit which utlizes only one I.C. comparator and one FET generates a sample gate pulse without requiring additional circuitry for timing and sync pulse generation.

Sone of the advantages of the present invention are the following: inexpensive, calibration-free, ease of use so as not to require interpretation, high accuracy on the order of 0.001 percent, simplicity, and temperature insensitive.

The present invention may be utilized in TWT beam current monitoring. It may be used as a module to allow digital panel meters, VTVM, or DVM to read peak pulse amplitude. Further, it may be utilized in a photoflash intensity converter. Still further, it may be a simplified hold circuit for pulse amplitude A/D conversion. Finally, it may be used in accurate "0" and"1" voltage determination for TTL type logic using dynamic pulse rather than static DC level testing.

SUMMARY OF THE INVENTION

A pulse peak sample and hold circuit is provided. The circuit comprises a passive input integrator to develop the time of the storage gate, a comparator which develops the gate pulse, and an FET and storage capacitor to hold the actual input amplitude. The invention uses a sample and hold technique for storing amplitudes of pulse waveforms without resorting to the development of external timing circuits.

DESCRIPTION OF THE PREFERRED EMBODIMENT

Figure 1:
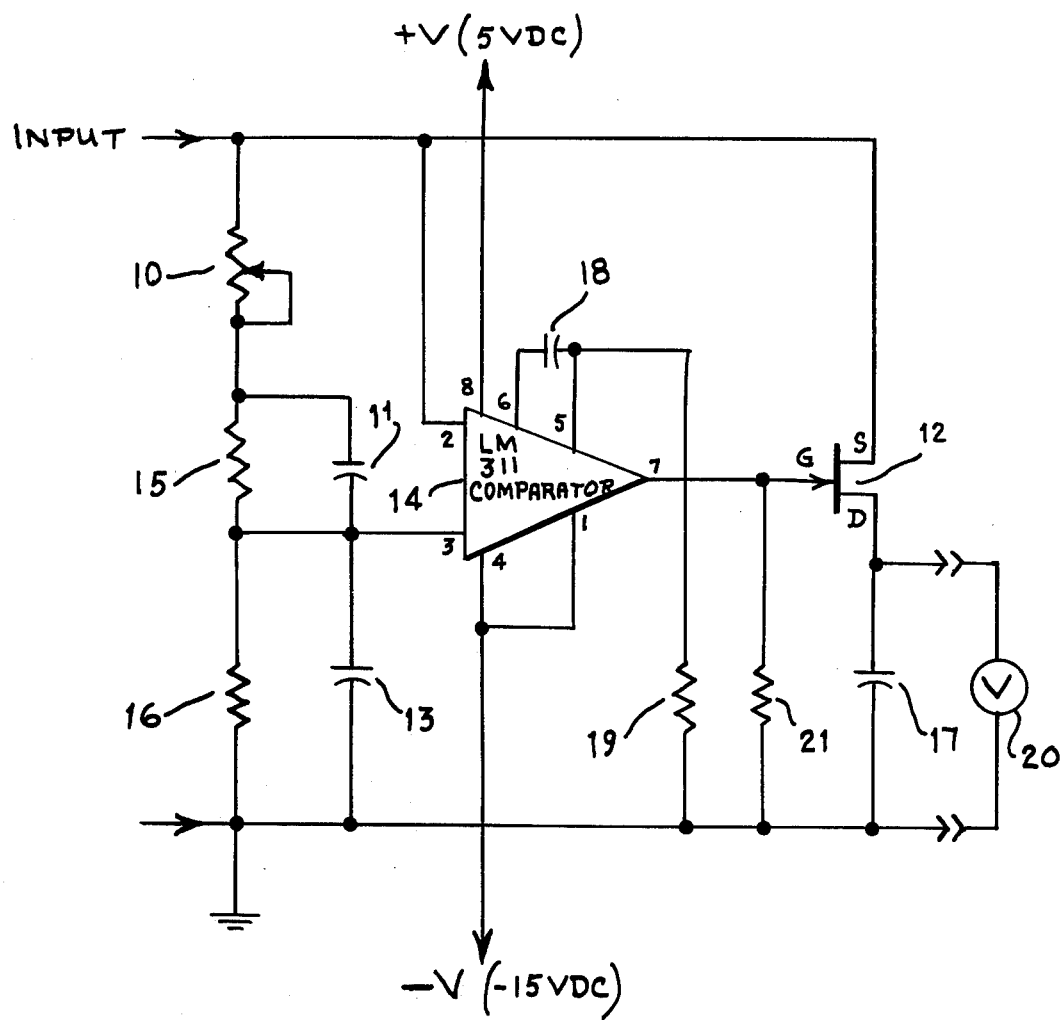
FIG. 1 illustrates in schematic form a preferred embodiment of the pulse peak sample and hold circuit.
Figure 2:
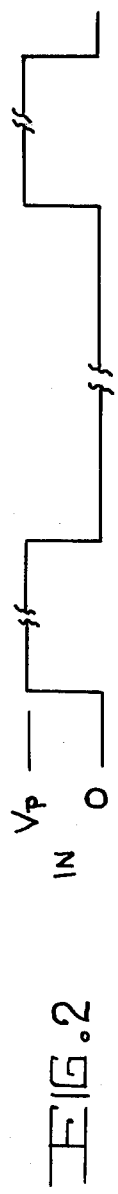
FIG. 2 shows the input waveform to the pulse peak sample and hold circuit.
Figure 3:
FIG. 3 shows the voltage waveforms on pin 3 of the comparator.
Figure 4:
FIG. 4 illustrates the voltage waveform across pins 2-3 of the comparator.
Figure 5:
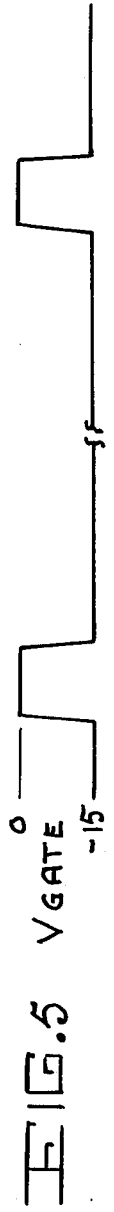
FIG. 5 shows the voltage waveform of the gate.
Figure 6:
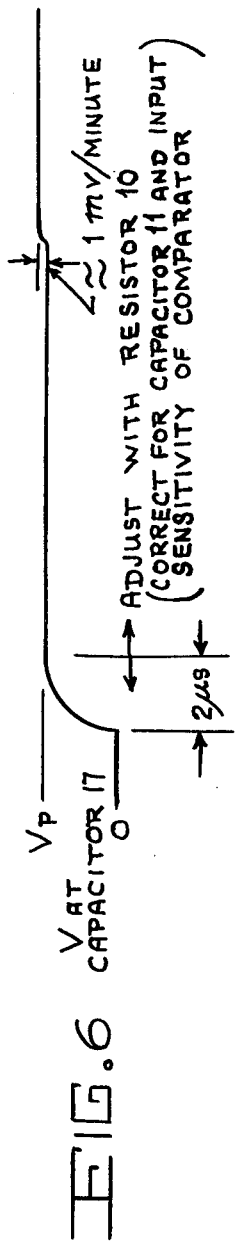
FIG. 6 shows the voltage waveform on the "hold" capacitor.

Referring in detail to FIG. 1, there is shown input integrator comprised of variable resistor 10 and capacitor 13 and FET switch 12. The pulses, as illustrated in FIG. 2, whose amplitude are to be determined are fed simultaneously to the input integrator and to the FET switch. Capacitor 13 charges through resistor 10. The time constant is adjusted so that capacitor 13 fully charges within the smallest anticipated pulse width. The waveform thereof is shown in FIG. 3. The voltage across resistor 10 and conventional comparator 14, as shown in FIG. 4, starts from V peak and decays to 0 as capacitor 13 charges. Hence comparator 14 is turned on until the voltage across resistor 10 becomes less than 1 mv, the sensitivity of comparator 14. Note that the DC resistive network of resistive divider 10, 15, and 16 is set up such that less than 1 mv is developed for a pulsed input since capacitor 11 essentially bypasses resistor 15. For a DC input, however, a resistive division between resistor 10 and resistor 15 to resistor 16 is set up, always turning the comparator on. This allows the circuit to also function for DC measurement. Comparator 14 develops the gate pulse necessary for the FET (field effect transistor) to operate. Capacitor 18 and resistor 19 are associated with comparator 14. Resistor 21 also associated with the comparator (sets up 0 level on gate in FIG. 5) is connected to ground from pin 7 of comparator 14. The gate waveform is illustrated in FIG. 5. The gate turns FET 12 on which in turn allows hold capacitor 17 to charge to the input pulse amplitude and pinches FET 12 off at the conclusion of the input (as determined by resistor 10). Storage capacitor 17 then holds the amplitude of the input for measurement with a high impedance device such as a DPM (voltmeter 20). The output waveform at capacitor 17 is shown in FIG. 6.

It is noted that the input must be a pulse or DC. The minimum puslewidth is in the region of 1 $\mu$s and is basically limited by the speed of the comparator, although tradeoffs can be made at small sampling pulsewidths (typically less than 2 or 3 $\mu$s) in output response time, since several pulses may be needed to fully charge the "hold" capacitor. Decreasing capacitor 17 will improve response time at the sacrifice of increased droop.

What is claimed is:

1. A pulse peak sample and hold circuit being comprised of an input integrator having a preselected time constant, said integrator including a variable resistor and capacitor, a switch field effect transistor normally off, a comparator having a preselected sensitivity, input pulses whose amplitude are to be determined being fed simultaneously and directly to said input integrator, said switch field effect transistor, and said comparator, said comparator also simultaneously receiving the output signal from said input integrator, the voltage across said comparator and across said resistor starting from a voltage peak and decaying to zero as said variable capacitor charges turning on said comparator until the voltage across said variable resistor becomes less than a preselected minimum voltage being said sensitivity of said comparator thus operating to provide an output gate pulse therefrom, a storage capacitor connected across the output of said switch field effect transistor, said output gate pulse being fed to said normally off switch field effect transistor turning it on allowing said storage capacitor to charge to the input pulse amplitude and pinching the field effect transistor off at the conclusion of the sample time as determined by said variable resistor, and a sensitive DC divider consisting of said variable resistor, first and second fixed resistors in series between a DC input and ground thus setting up a sensitive division between said variable, and said first and second fixed resistors always turning on said comparator.

* * * * *